United States Patent
Li et al.

(10) Patent No.: US 10,608,055 B2
(45) Date of Patent: Mar. 31, 2020

(54) AMOLED DISPLAY PANEL AND AMOLED DISPLAY HAVING VIRTUAL PIXEL AREA DISPOSED BETWEEN DISPLAY AREA AND BOUNDARY AREA

(71) Applicant: Wuhan China Star Optoelectronics Semiconductor Display Technology Co., Ltd., Wuhan, Hubei (CN)

(72) Inventors: Xiuyan Li, Guangdong (CN); Peng Li, Guangdong (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 15/746,649

(22) PCT Filed: Nov. 30, 2017

(86) PCT No.: PCT/CN2017/114063
§ 371 (c)(1),
(2) Date: Oct. 26, 2018

(87) PCT Pub. No.: WO2019/085129
PCT Pub. Date: May 9, 2019

(65) Prior Publication Data
US 2019/0386074 A1    Dec. 19, 2019

(30) Foreign Application Priority Data
Nov. 6, 2017  (CN) .......................... 2017 1 1076979

(51) Int. Cl.
*H01L 27/32* (2006.01)
*H01L 51/52* (2006.01)

(52) U.S. Cl.
CPC ...... *H01L 27/3223* (2013.01); *H01L 27/3246* (2013.01); *H01L 51/5206* (2013.01); *H01L 51/5221* (2013.01)

(58) Field of Classification Search
CPC .................. H01L 27/3223; H01L 51/5221
See application file for complete search history.

(56) References Cited

U.S. PATENT DOCUMENTS

2013/0342779 A1* 12/2013 Jung .................... G02B 6/0083
349/43
2014/0320553 A1   10/2014 Eom et al.

FOREIGN PATENT DOCUMENTS

| CN | 103984159 A | 8/2014 |
| CN | 105204213 A | 12/2015 |
| JP | 2002350885 A | 12/2002 |

* cited by examiner

*Primary Examiner* — Quoc D Hoang
(74) *Attorney, Agent, or Firm* — Hemisphere Law, PLLC; Zhigang Ma

(57) ABSTRACT

An AMOLED display panel comprises a display area and a non-display area. The display area has a plurality of pixel electrodes and the neighboring pixel electrodes are spaced apart from each other. The non-display area surrounds the display area and comprises a virtual pixel area and a boundary area. The virtual pixel area is close to the display area and has a plurality of virtual electrodes. At least part of the virtual electrodes are disposed close to the pixel electrodes at a boundary of the display area. The virtual electrodes and the pixel electrodes are formed by the same manufacturing process. The boundary area is close to the virtual pixel area or both the virtual pixel area and the display area. The virtual pixel area is located between the display area and the boundary area. The present invention may improve display uniformity of the AMOLED display panel.

3 Claims, 2 Drawing Sheets

AMOLED DISPLAY PANEL AND AMOLED DISPLAY HAVING VIRTUAL PIXEL AREA DISPOSED BETWEEN DISPLAY AREA AND BOUNDARY AREA

RELATED APPLICATIONS

The present application is a National Phase of International Application Number PCT/CN2017/114063, filed Nov. 30, 2017, and claims the priority of China Application 201711076979.0, filed Nov. 6, 2017.

FIELD OF THE DISCLOSURE

The present invention is related to display technology, and more particularly is related to an AMOLED display panel and an AMOLED display.

BACKGROUND

Organic light-emitting diode (OLED) display panels are welcome to the people because of the features of slim size, low power consumption, wide viewing angle, wide color gamut, high contrast, and etc. OLED display panels can be sorted as passive matrix OLED (PMOLED) display panels and active matrix OLED (AMOLED) display panels. The common AMOLED display panel includes a display area and a boundary area, and the boundary area surrounds the display area. The display area includes a plurality of anodes, a plurality of organic light-emitting layers, and a cathode covering the whole surface. These anodes and organic light-emitting layers are arranged in an array. Therefore, some anodes at the specific columns/lines are close to the center of the display area, and some are close to the boundary area (e.g. the anodes located at the boundary of the display area). During the process for forming the anodes, i.e. the development and etching processes, as the anodes at the center of the display area are properly formed under the etching treatment, some additional material of the anodes at the boundary of the display area would be etched due to the lack of anodes outside the anodes at the boundary of the display area, such that the size of the anodes at the boundary of the display area would be smaller than that at the center of the display area. To be more specific, that is, the length and the width would be different. Thus, even under the same design conditions, the actual size of the anodes would be different, e.g. different densities of anodes, which may cause a non-uniform image quality of the AMOLED display panel.

SUMMARY

It is a main object of the present invention to provide an AMOLED display panel and an AMOLED display for improving display uniformity of the AMOLED display panel to resolve the aforementioned technical problem.

In accordance with a first aspect of the present invention, an AMOLED display panel is provided in the present invention. The AMOLED display panel comprises a display area and a non-display area.

The display area has a plurality of pixel electrodes located therein, and the neighboring pixel electrodes are spaced apart from each other.

The non-display area is located outside the display area and surrounds the display area, wherein the non-display area comprises a virtual pixel area and a boundary area.

The virtual pixel area is close to the display area and has a plurality of virtual electrodes, wherein at least part of the virtual electrodes are disposed close to the pixel electrodes at a boundary of the display area, and the virtual electrodes and the pixel electrodes are formed by using an identical manufacturing process.

The boundary area is close to the virtual pixel area or both the virtual pixel area and the display area, wherein the virtual pixel area is located between the display area and the boundary area.

In accordance with an embodiment of the present invention, wherein the virtual pixel area is located at one side, two sides, or three sides of the display area, and the boundary area is close to the virtual pixel area and the display area.

In accordance with an embodiment of the present invention, wherein the virtual pixel area surrounds the display area, and the boundary area surrounds the virtual pixel area.

In accordance with an embodiment of the present invention, wherein size and arrangement of the virtual electrodes are the same as that of the corresponding pixel electrodes.

In accordance with an embodiment of the present invention, wherein the display area includes multiple columns of the pixel electrodes and multiple rows of the pixel electrodes, the virtual pixel area includes multiple columns of the virtual electrodes and multiple rows of the virtual electrodes, at least a portion of the multiple columns of the virtual electrodes is disposed on an extension line of the multiple columns of the pixel electrodes, and at least a portion of the multiple rows of the virtual electrodes is disposed on an extension line of the multiple rows of the pixel electrodes.

In accordance with an embodiment of the present invention, wherein a row or a column of the virtual electrodes closest to the display area includes a first portion and a second portion, wherein the first portion is located in the display area, and the second portion is located in the virtual pixel area.

In accordance with an embodiment of the present invention, wherein the pixel electrode is an anode of the AMOLED display panel, and correspondingly, the virtual electrode is a virtual anode.

In accordance with an embodiment of the present invention, wherein an organic light emitting layer and a cathode are located above the plurality of the pixel electrodes respectively, the cathodes are connected to form a whole surface extending to a position above the virtual electrode, and an organic photoresist layer is interposed between the virtual electrode and the cathode.

In accordance with an embodiment of the present invention, wherein the pixel electrode is a cathode of the AMOLED display panel, and correspondingly, the virtual electrode is a virtual cathode.

In accordance with a second aspect of the present invention, an AMOLED display, which includes the aforementioned AMOLED display panel, is provided.

The embodiments of the present invention have the following advantages:

The AMOLED display panel includes a non-display area, the non-display area includes a virtual pixel area which is arranged close to the display area, the virtual pixel area includes a plurality of virtual electrodes, at least some of the virtual electrodes are arranged close to the pixel electrodes at the boundary of the display area, and the virtual electrodes and the pixel electrodes are manufactured by the same process. Thus, during the development and etching processes for forming the pixel electrodes, because of the existence of the metal layer for forming the virtual anodes, which is located outside the metal layer for forming the pixel electrodes close to the boundary, the pixel electrodes close to the boundary and the pixel electrode close to the center may have a substantially identical etching amount, such that the size of the pixel electrodes close to the boundary would be substantially identical to the pixel electrodes close to the center. Thus, the AMOLED display panel would have uniform illumination to generate a better display quality.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

The specific structural and functional details disclosed herein are only representative and are intended for describing exemplary embodiments of the disclosure. However, the disclosure can be embodied in many forms of substitution, and should not be interpreted as merely limited to the embodiments described herein.

In the description of the disclosure, the term "comprise" and any variations thereof are meant to cover a non-exclusive inclusion. For example, a process, a method, a system, a product, or an apparatus comprising a sequence of steps or units does not exclude the steps or units which are not listed. Moreover, terms such as "first", "second", and "third" are merely for the purpose of illustration and cannot be understood as indicating or implying the specific order.

Figure 1:
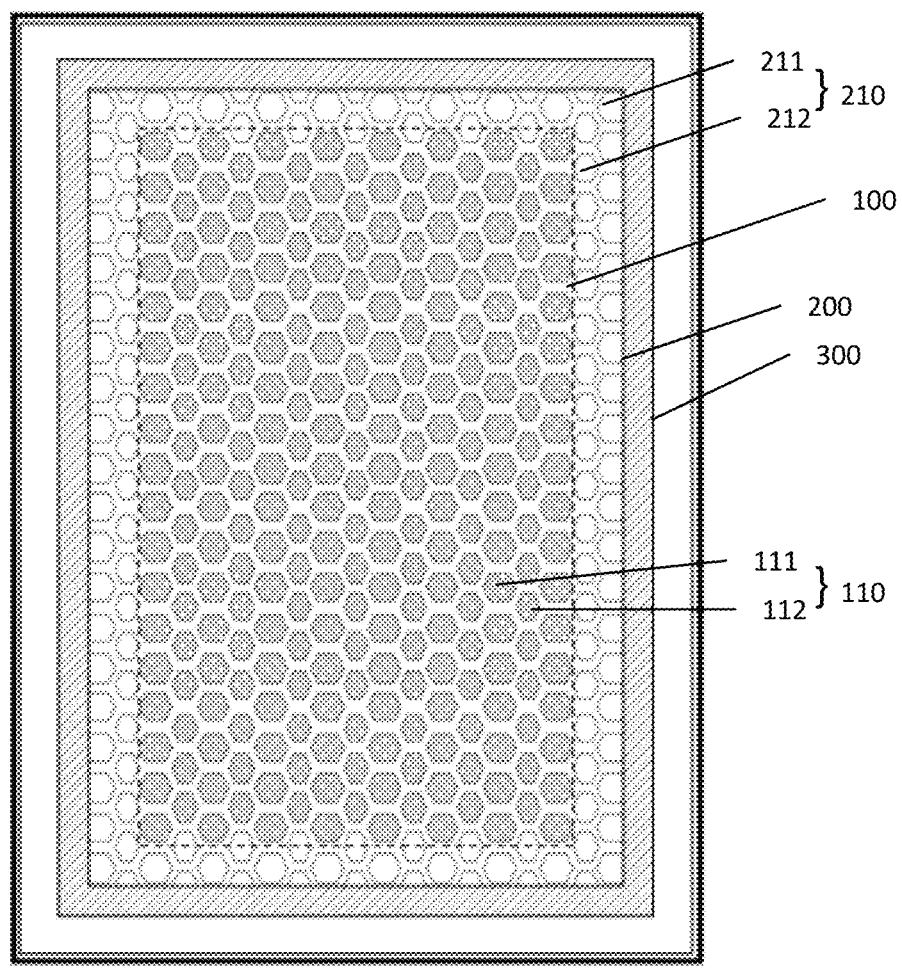
FIG. 1 is a top view of the AMOLED display panel provided in accordance with an embodiment of the present invention.

As shown in FIG. 1, an AMOLED display panel is provided in accordance with an embodiment of the present invention. The AMOLED display panel includes a display area 100 and a non-display area.

In the present embodiment, the display area 100 is the area visible by the user. The display area 100 has a plurality of pixel electrodes 110 located therein, and the neighboring pixel electrodes 110 are spaced apart from each other. These pixel electrodes 110 compose an array with multiple columns of pixel electrodes 110 and multiple rows of pixel electrodes 110. In the present embodiment, these pixel electrodes 110 include first pixel electrodes 111 and second pixel electrodes 112. The area size of the first pixel electrode 111 is greater than the area size of the second pixel electrode 112. However, in the other embodiments of the present invention, the pixel electrodes 110 may be of the same size, or include the pixel electrodes with more than two different sizes. In the present embodiment, the first pixel electrodes 111 compose an array with multiple columns and multiple rows, and the second pixel electrodes 112 also compose an array with multiple columns and multiple rows. The multiple rows of the first pixel electrodes 111 and the multiple rows of the second pixel electrodes 112 are arranged alternatively, i.e. one row of the first pixel electrodes 111, one row of the second pixel electrodes 112, one row of the first pixel electrodes 111, one row of the second pixel electrodes 112, and so on alternatively arranged in a serial. The multiple columns of the first pixel electrodes 111 and the multiple columns of the second pixel electrodes 112 are arranged alternatively, i.e. one column of the first pixel electrodes 111, one column of the second pixel electrodes 112, one column of the first pixel electrodes 111, one column of the second pixel electrodes 112, and so on alternatively arranged in a serial. In addition, in the other embodiment of the present invention, the multiple rows of the first pixel electrodes and the multiple rows of the second pixel electrodes may be alternatively arranged rows by rows, e.g. two rows of the first pixel electrodes, two rows of the second pixel electrodes, two rows of the first pixel electrodes, two rows of the second pixel electrodes, and so on alternatively arranged in a serial. The multiple columns of the first pixel electrodes and the multiple columns of the second pixel electrodes may be alternatively arranged columns by columns, e.g. three columns of the first pixel electrodes, three columns of the second pixel electrodes, three columns of the first pixel electrodes, three columns of the second pixel electrodes, and so on alternatively arranged in a serial.

In the present embodiment, the non-display area is located outside the display area 100 and surrounds the display area 100. The non-display area is the invisible area by the user, such as the area covered by the frame. In the present embodiment, the non-display area includes the virtual pixel area 200 and the boundary area 300.

In order to prevent size variation between the pixel electrodes 110 near the non-display area and the center position resulted by the development and etching processes, the virtual pixel area 200 is added in the present embodiment to resolve the problem. Concretely speaking, in the present embodiment, the virtual pixel area 200 surrounds the display area 100, that is, the virtual pixel area 200 is located around the top, the bottom, the left and the right sides of the display area 100. However, in the other embodiments of the present invention, the virtual pixel area 200 may be just located at one of the top, the bottom, the left and the right sides of the display area, or located around two or three of them. For example, as the virtual pixel area is located around three of the four sides of the display area, one side of the display area would be arranged without the virtual pixel area. In the present embodiment, the virtual pixel area 200 includes a plurality of virtual electrodes 210, and at least a portion of the virtual electrodes 210 are adjacent to the pixel electrodes 110 close to the boundary of the display area 100. Concretely speaking, the virtual electrodes 210 includes a first column of the virtual electrodes 210, a second column of the virtual electrodes 210, a first row of the virtual electrodes 210, and a second row of the virtual electrodes. The first column of the virtual electrodes 210 is adjacent to the leftmost column of the pixel electrodes 110 in FIG. 1, the second column of the virtual electrodes 210 is adjacent to the rightmost column of the pixel electrodes 110 in FIG. 1, the first row of the virtual electrodes 210 is adjacent to the topmost row of the pixel electrodes 110 in FIG. 1, and the second row of the virtual electrodes 210 is adjacent to the bottommost row of the pixel electrodes 110 in FIG. 1. In the present embodiment, the virtual electrodes 210 and the pixel electrodes 110 are manufactured by the same process. Concretely speaking, the pixel electrodes 110 and the virtual electrodes 210 are simultaneously formed by using the same development and etching processes. During the development and etching processes, because of the existence of the metal layer for forming the virtual electrodes 210, which is located outside the metal layer for forming the pixel electrodes 110 close to the boundary, the amounts of metal material etched from the pixel electrodes 110 close to the boundary of the display area 100 and that from the pixel electrodes 110 close to the center would be the same or substantially the same, such that the size of the pixel electrodes 110 close to the boundary of the display area 100 would be identical or substantially identical to the pixel electrodes 110 close to the center. Thus, the display quality of the AMOLED display panel would be more uniform. Meanwhile, in compared with the virtual electrodes 210 located at the center of the virtual pixel area 200, a greater amount of metal material would be etched from the virtual electrodes 210 away from the pixel electrodes 110 (i.e. the virtual electrodes 210 located at the exterior edge of the virtual pixel area 200), such that the size of the virtual electrodes 210 close to the exterior edge of the virtual pixel area 200 would be smaller than the virtual electrodes 210 at the center. However, because the virtual electrodes 210 are shielded or non-illuminated, the size variation between the virtual electrodes 210 at the edge and the virtual electrodes 210 at the center would have no effect to the display quality of the AMOLED display panel. Thus, in general, the additional virtual pixel area 200 is helpful for improving brightness uniformity and display quality of the AMOLED display panel.

In the present embodiment, the boundary area 300 is arranged adjacent to the virtual pixel area 200, the boundary area 300 is located outside the virtual pixel area 200, and the boundary area 300 surrounds the virtual pixel area 200, i.e. the boundary area 300 is located around the four sides of the virtual pixel area 200, and the virtual pixel area 200 is located between the display area 100 and the boundary area 300. In the present embodiment, there have some rectangular low-level electrodes and some electrostatic discharge circuits located in boundary area 300. In addition, in the other embodiments of the present invention, as the virtual pixel area is just located around one, two or, three sides of the top, the bottom, the left and the right sides of the display area, the boundary area would be located around both the virtual pixel area and the display area, that is, if there exists the virtual pixel area outside the display area, the boundary area would be located around the virtual pixel area, but if there has no virtual pixel area located outside the display area, the boundary area would be located around the display area directly.

In order to maintain size uniformity of the pixel electrodes at the boundary and the center of the display area, in the present embodiment, size and arrangement of the virtual electrodes 210 are configured to be the same as that of the corresponding pixel electrodes 110. Concretely speaking, the virtual electrodes 210 include first virtual electrodes 211 and second virtual electrodes 212, size of the first virtual electrode 211 is identical to that of the first pixel electrode 111, size of the second virtual electrode 212 is identical to that of the second pixel electrode 112. In the present embodiment, the virtual pixel area 200 includes multiples columns of the first virtual electrodes 211, multiple rows of the first virtual electrodes 211, multiple columns of the second virtual electrodes 212, and multiple rows of the second virtual electrodes 212, wherein, as shown in FIG. 1, the multiple rows of the first virtual electrodes 211 are corresponding to the multiple rows of the first pixel electrodes 111, i.e. the multiple rows of the first virtual electrodes 211 are located at the extension line of the multiple rows of the first pixel electrodes 111, and the multiple rows of the second virtual electrodes 212 are corresponding to the multiple rows of the second pixel electrodes 112, i.e. the multiple rows of the second virtual electrodes 212 are located at the extension line of the multiple rows of the second pixel electrodes 112; similarly, the multiple columns of the first virtual electrodes 211 are corresponding to the multiple columns of the first pixel electrodes 111, i.e. the multiple columns of the first virtual electrodes 211 are located at the extension line of the multiple columns of the first pixel electrodes 111, and the multiple columns of the second virtual electrodes 212 are corresponding to the multiple columns of the second pixel electrodes 112, i.e. the multiple columns of the second virtual electrodes 212 are located at the extension line of the multiple columns of the second pixel electrodes 112. In addition, the spacing between the neighboring virtual electrodes 210 and the positional relationship thereof are the same as that of the neighboring pixel electrodes 110. Therefore, the arrangement of the virtual electrodes 210 is the same as that of the pixel electrodes 110. In the present embodiment, because size and arrangement of the virtual electrodes 210 are the same as that of the corresponding pixel electrodes 110, the density of the virtual electrodes 210 would be identical to that of the pixel electrodes 110, such that when taking the display area 100 and the virtual pixel area 200 as a whole, the pixel electrodes 110 at the boundary of the display area 100 and the pixel electrodes 110 at the center of the display area 100 would have a common condition, i.e. there exist some virtual electrodes 210 outside the pixel electrodes 110 at the boundary of the display area 100. Thus, after the development and etching processes, the size of the pixel electrodes 110 at the boundary of the display area 100 would be identical to that of the pixel electrodes 110 at the center of the display area 100, such that brightness uniformity and display quality of the AMOLED display panel can be improved.

In the present embodiment, the row of the virtual electrodes 210 closest to the display area 100 includes a first portion and a second portion, wherein the first portion is located in the display area 100 and the second portion is located in the virtual pixel area 200. The size of the first portion and that of the second portion can be the same or not. Moreover, in the other embodiments of the present invention, the column of the virtual electrodes closest to the display area may include a third portion and a fourth portion, wherein the third portion is located in the display area and the fourth portion is located in the virtual pixel area. The size of the third portion and that of the fourth portion can be the same or not.

Figure 2:
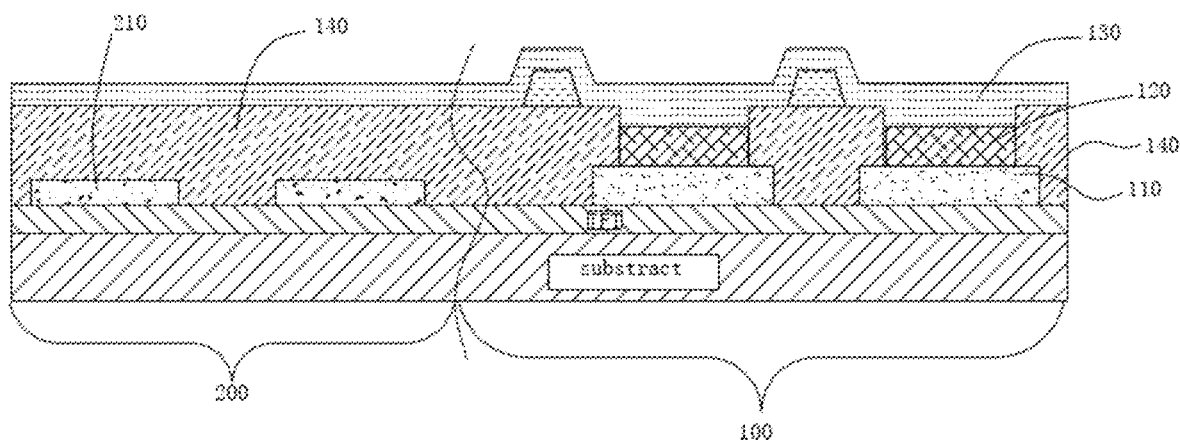
FIG. 2 is a cross-section view of the AMOLED display panel provided in accordance with an embodiment of the present invention.

Please refer to both FIG. 1 and FIG. 2, in the present embodiment, the pixel electrode 110 is the anode of the AMOLED display panel, and correspondingly, the virtual electrode 210 is the virtual anode. The anode and the virtual anode are formed on the same metal layer and by using the same process. In the present embodiment, an organic light-emitting layers (OLED) 120 and a cathode 130 are serially formed on the anode. The organic light-emitting layers 120 are arranged corresponding to the anodes, i.e. the organic light-emitting layers 120 are arranged in an array one by one and the neighboring organic light-emitting layers 120 are spaced apart from each other. The cathodes 130 are connected to cover the whole surface. In the present embodiment, these organic light-emitting layers 120 are encircled by a pixel definition layer 140. The organic light-emitting layers 120 are filled in the holes formed by the pixel definition layer 140. The pixel definition layer 140 is an organic photoresist layer. In the present embodiment, the pixel definition layer 140 extends to the position above the virtual anodes, but there has no organic light-emitting layer 120 located above the virtual anodes, such that the virtual pixel area 200 is not illuminable. The cathode extends to the position above the virtual anodes. Moreover, in the other embodiments of the present invention, the pixel electrodes can be the cathode of the AMOLED display panel, and correspondingly, the virtual electrode is the virtual cathode. At this time, the AMOLED display panel has multiple independent cathodes, rather than a cathode covering the whole surface. Correspondingly, the anode covers the whole surface, and the cathodes are located under the anode. Moreover, in the other embodiments of the present invention, these pixel electrodes can be both the cathodes and the anodes of the AMOLED display panel such that the neighboring cathodes are spaced apart from each other, the neighboring anodes are spaced apart from each other, the anodes are arranged corresponding to the cathodes, and the light emitting layer is interposed between the anode and the cathode. Correspondingly, the virtual electrodes are the virtual cathodes and the virtual anodes with an non-illuminated organic photoresist layer interposed therebetween.

Moreover, in the present embodiment, a thin film transistor, a scan line, a data line, and a lower substrate are located under the pixel electrodes 110 and the virtual electrodes 210. The manufacturing technology for forming the thin film transistor, the scan line, and the data line on the lower substrate is well known in the field and thus is not repeated here. In the present embodiment, the pixel electrode 110 is connected to the corresponding scan line and data line through the thin film transistor.

An AMOLED display is also provided in accordance with an embodiment of the present invention, which includes the aforementioned AMOLED display panel.

It is noted that, the embodiments in the specification are described one by one, and emphasize on the distinction between these embodiments. The common feature can be referred to each other. For the device embodiments, because the technical feature is substantially similar to the method embodiments, the description is simpler and the related features can be referred to the method embodiments.

In accordance with the description of the aforementioned embodiments, the present invention has the following advantages.

The AMOLED display panel includes a non-display area, the non-display area includes a virtual pixel area which is arranged close to the display area, the virtual pixel area includes a plurality of virtual electrodes, at least some of the virtual electrodes are arranged close to the pixel electrodes at the boundary of the display area, and the virtual electrodes and the pixel electrodes are manufactured by the same process. Thus, during the development and etching processes for forming the pixel electrodes, because of the existence of the metal layer for forming the virtual anodes, which is located outside the metal layer for forming the pixel electrodes close to the boundary, the pixel electrodes close to the boundary and the pixel electrode close to the center may have a substantially identical etching amount, such that the size of the pixel electrodes close to the boundary would be substantially identical to the pixel electrodes close to the center. Thus, the AMOLED display panel would have uniform illumination to generate a better display quality.

The foregoing contents are detailed description of the disclosure in conjunction with specific preferred embodiments and concrete embodiments of the disclosure are not limited to the description. For the person skilled in the art of the disclosure, without departing from the concept of the disclosure, simple deductions or substitutions can be made and should be included in the protection scope of the application.

What is claimed is:

1. An AMOLED display panel, comprising:
a display area, having a plurality of pixel electrodes located therein, and the neighboring pixel electrodes being spaced apart from each other; and
a non-display area, located outside the display area and surrounding the display area, wherein the non-display area comprises:
a virtual pixel area, close to the display area, and having a plurality of virtual electrodes, wherein at least part of the virtual electrodes are disposed close to the pixel electrodes at a boundary of the display area, and the virtual electrodes and the pixel electrodes are formed by using an identical manufacturing process; and
a boundary area, close to the virtual pixel area or both the virtual pixel area and the display area, wherein the virtual pixel area is located between the display area and the boundary area;
wherein size and arrangement of the virtual electrodes are the same as that of the corresponding pixel electrodes;
wherein the display area includes multiple columns of the pixel electrodes and multiple rows of the pixel electrodes, the virtual pixel area includes multiple columns of the virtual electrodes and multiple rows of the virtual electrodes, at least a portion of the multiple columns of the virtual electrodes is disposed on an extension line of the multiple columns of the pixel electrodes, and at least a portion of the multiple rows of the virtual electrodes is disposed on an extension line of the multiple rows of the pixel electrodes.

2. An AMOLED display panel, comprising:
a display area, having a plurality of pixel electrodes located therein, and the neighboring pixel electrodes being spaced apart from each other; and
a non-display area, located outside the display area and surrounding the display area, wherein the non-display area comprises:
a virtual pixel area, close to the display area, and having a plurality of virtual electrodes, wherein at least part of the virtual electrodes are disposed close to the pixel electrodes at a boundary of the display area, and the virtual electrodes and the pixel electrodes are formed by using an identical manufacturing process; and
a boundary area, close to the virtual pixel area or both the virtual pixel area and the display area, wherein the virtual pixel area is located between the display area and the boundary area;
wherein a row or a column of the virtual electrodes closest to the display area includes a first portion and a second portion, wherein the first portion is located in the display area, and the second portion is located in the virtual pixel area.

3. An AMOLED display panel, comprising:
a display area, having a plurality of pixel electrodes located therein, and the neighboring pixel electrodes being spaced apart from each other; and
a non-display area, located outside the display area and surrounding the display area, wherein the non-display area comprises:
a virtual pixel area, close to the display area, and having a plurality of virtual electrodes, wherein at least part of the virtual electrodes are disposed close to the pixel electrodes at a boundary of the display area, and the virtual electrodes and the pixel electrodes are formed by using an identical manufacturing process; and a boundary area, close to the virtual pixel area or both the virtual pixel area and the display area, wherein the virtual pixel area is located between the display area and the boundary area;

wherein the pixel electrode is an anode of the AMOLED display panel, and correspondingly, the virtual electrode is a virtual anode;

wherein an organic light emitting layer and a cathode are located above the plurality of the pixel electrodes respectively, the cathodes are connected to form a whole surface extending to a position above the virtual electrode, and an organic photoresist layer is interposed between the virtual electrode and the cathode.

* * * * *